(12) United States Patent
Hsieh et al.

(10) Patent No.: US 7,431,592 B2
(45) Date of Patent: Oct. 7, 2008

(54) CIRCUIT PROTECTING STRUCTURE OF ELECTRONIC DEVICE

(75) Inventors: Hung-Chang Hsieh, Taoyuan (TW); Ming-Ling Huang, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/737,583

(22) Filed: Apr. 19, 2007

(65) Prior Publication Data

US 2008/0124953 A1    May 29, 2008

(30) Foreign Application Priority Data

Nov. 28, 2006    (TW) .............................. 95144049 A

(51) Int. Cl.
*H01R 12/00*    (2006.01)
(52) U.S. Cl. .................................... 439/76.1
(58) Field of Classification Search ................ 439/76.1; 361/816–818
See application file for complete search history.

(56) References Cited

U.S. PATENT DOCUMENTS

| | | | | |
|---|---|---|---|---|
| 4,370,515 | A * | 1/1983 | Donaldson | 174/387 |
| 5,412,340 | A * | 5/1995 | Tanikoshi | 330/68 |
| 5,436,802 | A * | 7/1995 | Trahan et al. | 361/816 |
| 5,726,867 | A * | 3/1998 | Zarreii | 361/818 |
| 6,392,900 | B1 * | 5/2002 | Petty et al. | 361/816 |
| 7,095,624 | B2 * | 8/2006 | Daoud et al. | 361/800 |

* cited by examiner

*Primary Examiner*—Tho D Ta

(57) ABSTRACT

A circuit protecting structure of an electronic device includes a circuit carrier and a shielding member. The circuit carrier includes a first surface and a second surface. The second surface includes a specific region thereon. The shielding member includes a shielding frame and a shielding plate. The shielding frame is arranged on the second surface of the circuit carrier and encloses the specific region. The shielding plate is fixed onto the shielding frame. The shielding frame and the shielding plate cooperatively define a closed space for accommodating and shielding the specific region of the circuit carrier.

20 Claims, 11 Drawing Sheets

US 7,431,592 B2

CIRCUIT PROTECTING STRUCTURE OF ELECTRONIC DEVICE

FIELD OF THE INVENTION

The present invention relates to a protecting structure of an electronic device, and more particularly to a circuit protecting structure of an electronic device.

BACKGROUND OF THE INVENTION

Recently, computers and power supply apparatuses become essential electronic devices. During operation, the electronic components of the computer or power supply apparatus may generate energy in the form of heat. As a result, the inner space within the housing of the computer or power supply apparatus is readily warmed up.

When the printed circuit board of the computer or power supply apparatus becomes warm, the warm environment may invite cockroaches to build nests on or around the computer or power supply apparatus because the warm environment favors the growth of the cockroaches. Usually, the droppings or carcasses of the cockroaches may result in a continuity failure or damage of the printed circuit board. Moreover, if the cockroaches come into contact with the high-voltage wiring region at the primary side of the printed circuit board, the whole computer or power supply apparatus may be short-circuited or have a breakdown. Therefore, undesirable system failure or data damage occurs, which needs additional maintenance cost.

Therefore, there is a need of providing a circuit protecting structure of an electronic device to prevent foreign matters from entering a specific region of the printed circuit board.

SUMMARY OF THE INVENTION

It is an object of the present invention to provide a circuit protecting structure of an electronic device for protecting the specific region of the circuit carrier, thereby preventing foreign matters from entering the specific region.

In accordance with an aspect of the present invention, there is provided a circuit protecting structure of an electronic device. The circuit protecting structure includes a circuit carrier and a shielding member. The circuit carrier includes a first surface and a second surface. The second surface includes a specific region thereon. The shielding member includes a shielding frame and a shielding plate. The shielding frame is arranged on the second surface of the circuit carrier and encloses the specific region. The shielding plate is fixed onto the shielding frame. The shielding frame and the shielding plate cooperatively define a closed space for accommodating and shielding the specific region of the circuit carrier.

In accordance with an aspect of the present invention, there is provided a circuit protecting structure of an electronic device. The circuit protecting structure includes a housing, a circuit carrier and a shielding member. The housing includes a cover plate and a frame body. The circuit carrier is disposed within the housing and includes a first surface and a second surface, wherein the second surface includes a specific region thereon. The shielding member includes a shielding frame, which is arranged on the second surface of the circuit carrier and encloses the specific region. The cover plate is in contact with the shielding frame to define a closed space for accommodating and shielding the specific region of the circuit carrier.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figures 1A, 1B:
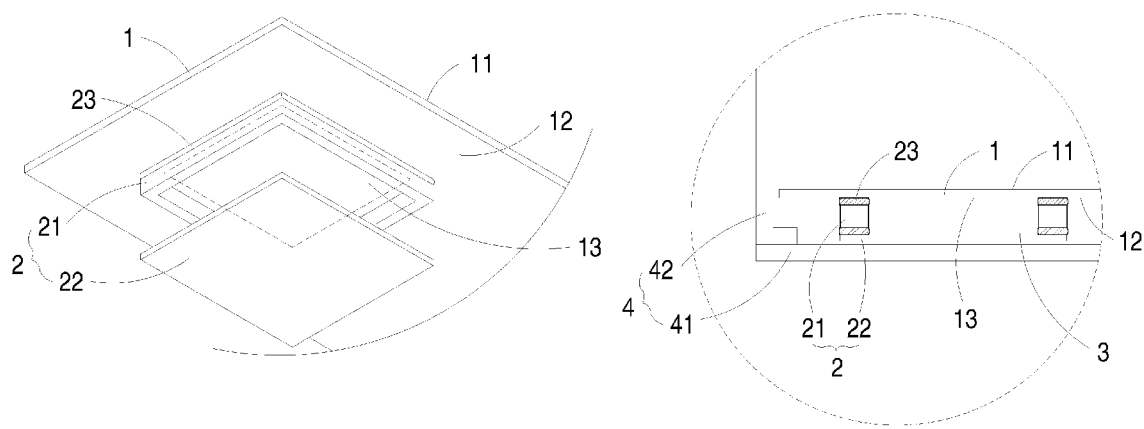
FIG. 1(a) is a schematic perspective view illustrating a circuit protecting structure of an electronic device according to a preferred embodiment of the present invention.
FIG. 1(b) is a partial cross-sectional view illustrating the electronic device having the circuit protecting structure of FIG. 1(a)

Please refer to FIG. 1(a), which is a schematic perspective view illustrating a circuit protecting structure of an electronic device according to a preferred embodiment of the present invention. The electronic device is for example a power supply apparatus or a computer. The circuit protecting structure is used to prevent foreign matters such as vermin from entering a specific region of a circuit carrier such as a printed circuit board. The specific region is for example a high-voltage wiring region at the primary side of the printed circuit board. As shown in FIG. 1(a), the circuit protecting structure of this embodiment includes a circuit carrier 1 and a shielding member 2. The circuit carrier 1 includes a first surface 11 and a second surface 12. Many electronic components (not shown) are mounted on the first surface 11 of the circuit carrier 1. The specific region 13 is disposed on the second surface 12 of the circuit carrier 1. The shielding member 2 includes a shielding frame 21 and a shielding plate 22. The shielding frame 21 is arranged on the second surface 12 of the circuit carrier 1 and encloses the specific region 13. The shielding plate 22 is fixed onto the shielding frame 21. The shielding frame 21 and the shielding plate 22 cooperatively define a closed space for accommodating and shielding the specific region 13 of the circuit carrier 1, thereby preventing foreign matters from entering the specific region 13. In some embodiment, the shielding frame 21 is made of insulating material such as rubbery or plastic material.

Please refer to FIG. 1(b), which is a partial cross-sectional view illustrating the electronic device having the circuit protecting structure of FIG. 1(a). In this embodiment, the shielding member 2 is coupled to the circuit carrier 1 via a bonding mechanism. As shown in FIG. 1(b), the circuit carrier 1 is arranged within a housing 4 of the electronic device. The housing 4 includes a cover plate 41 and a frame body 42. Via an adhesive medium 23, the shielding frame 21 is bonded onto the second surface 12 of the circuit carrier 1 so as to enclose the specific region 13. The shielding plate 22 is fixed onto the shielding frame 21 via a fastening, bonding or screwing mechanism. As a consequence, the shielding frame 21 and the shielding plate 22 cooperatively define the closed space 3 for accommodating and shielding the specific region 13 of the circuit carrier 1, thereby preventing foreign matters from entering the specific region 13.

Figures 2A, 2B:
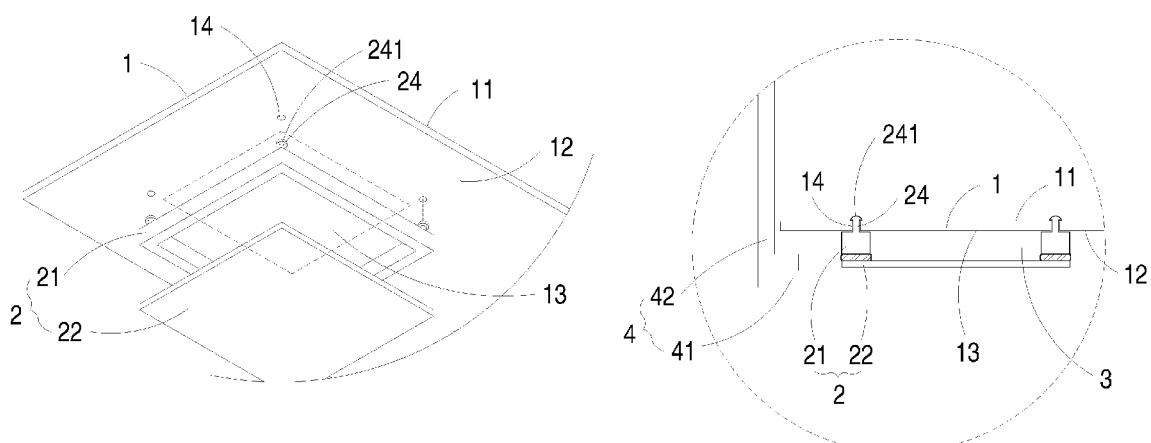
FIG. 2(a) is a schematic perspective view illustrating another circuit protecting structure of the present invention by fixing the shielding frame on the circuit carrier via a fastening mechanism.
FIG. 2(b) is a partial cross-sectional view illustrating the electronic device having the circuit protecting structure of FIG. 2(a)

A further embodiment of a circuit protecting structure is illustrated in FIGS. 2(a) and 2(b). In this embodiment, the shielding member 2 is coupled to the circuit carrier 1 via a fastening mechanism. The circuit carrier 1 is arranged within a housing 4 of the electronic device. The housing 4 includes a cover plate 41 and a frame body 42. For fixing the shielding frame 21 to the circuit carrier 1, the bottom of the shielding frame 21 has several first connecting parts 24 (e.g. protrusion posts) and the circuit carrier 1 further includes several second connecting parts 14 (e.g. perforations) corresponding to the first connecting parts 24. The first connecting part 24 (e.g. protrusion post) has expanded free end 241 penetrating through the first connecting part 14 (e.g. perforation) and then sustained against the first surface 11 of the circuit carrier 1, so that the shielding frame 21 is fixed onto the circuit carrier 1 and encloses the specific region 13. The shielding plate 22 is fixed onto the shielding frame 21 via a fastening, bonding or screwing mechanism. As a consequence, the shielding frame 21 and the shielding plate 22 cooperatively define the closed space 3 for accommodating and shielding the specific region 13 of the circuit carrier 1, thereby preventing foreign matters from entering the specific region 13.

Figures 3A, 3B:
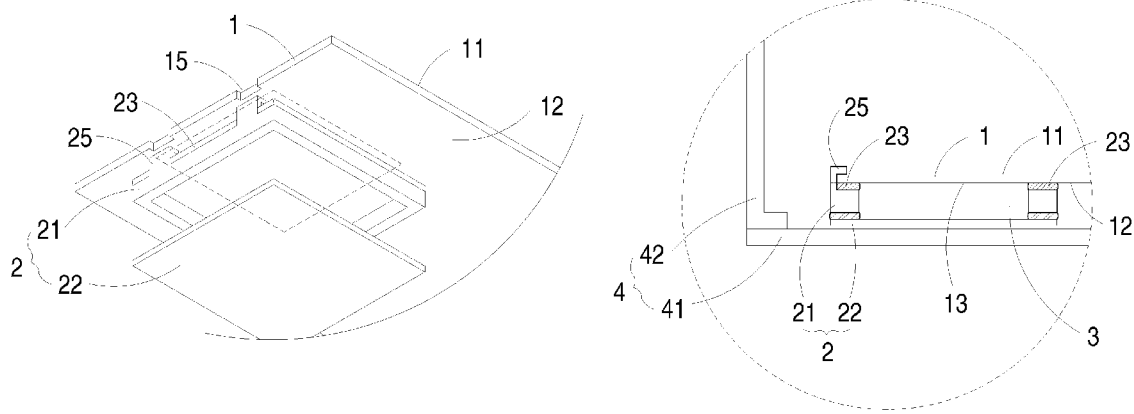
FIG. 3(a) is a schematic perspective view illustrating another circuit protecting structure of the present invention by fixing the shielding frame on the circuit carrier via a fastening mechanism and a bonding mechanism.
FIG. 3(b) is a partial cross-sectional view illustrating the electronic device having the circuit protecting structure of FIG. 3(a)

A further embodiment of a circuit protecting structure is illustrated in FIGS. 3(a) and 3(b). In this embodiment, the shielding member 2 is coupled to the circuit carrier 1 via a fastening mechanism and a bonding mechanism. The circuit carrier 1 is arranged within a housing 4 of the electronic device. The housing 4 includes a cover plate 41 and a frame body 42. For fixing the shielding frame 21 to the circuit carrier 1, the edges of the circuit carrier 1 further include several notches 15 and the shielding frame 21 has several hooking elements 25 corresponding to the notches 15. The hooking elements 25 are attached onto the first surface 11 of the circuit carrier 1 through the notches 15, so that the shielding frame 21 is fixed onto the second surface 12 of the circuit carrier 1 and encloses the specific region 13. For facilitating secure attachment of the shielding frame 21, the shielding frame 21 is also bonded onto the second surface 12 of the circuit carrier 1 via an adhesive medium 23. The shielding plate 22 is fixed onto the shielding frame 21 via a fastening, bonding or screwing mechanism. As a consequence, the shielding frame 21 and the shielding plate 22 cooperatively define the closed space 3 for accommodating and shielding the specific region 13 of the circuit carrier 1, thereby preventing foreign matters from entering the specific region 13.

Figures 4A, 4B:
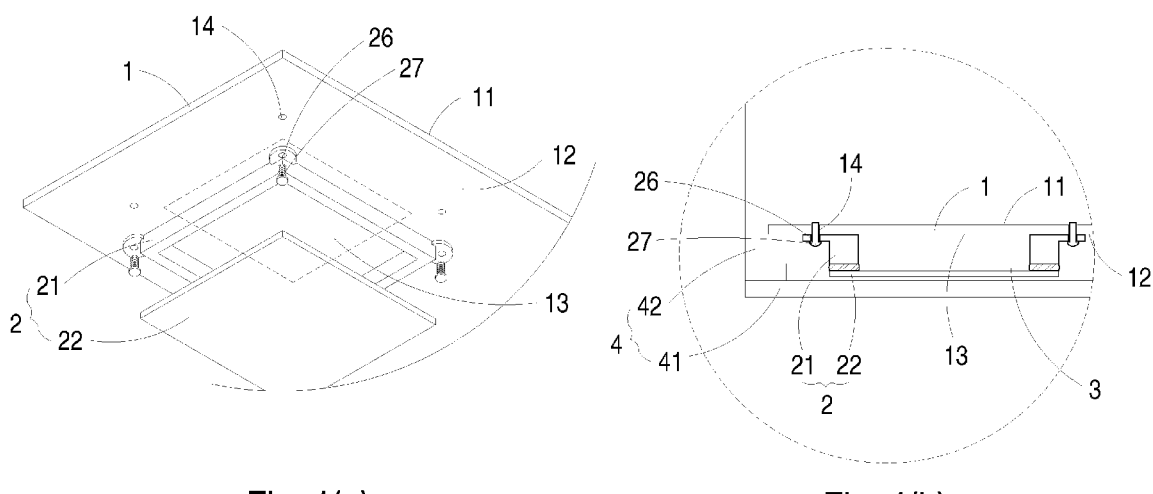
FIG. 4(a) is a schematic perspective view illustrating another circuit protecting structure of the present invention by fixing the shielding frame on the circuit carrier via a screwing mechanism.
FIG. 4(b) is a partial cross-sectional view illustrating the electronic device having the circuit protecting structure of FIG. 4(a)

A further embodiment of a circuit protecting structure is illustrated in FIGS. 4(a) and 4(b). In this embodiment, the shielding member 2 is coupled to the circuit carrier 1 via a screwing mechanism. The circuit carrier 1 is arranged within a housing 4 of the electronic device. The housing 4 includes a cover plate 41 and a frame body 42. The shielding frame 21 has several first connecting parts 26 (e.g. perforations) and the circuit carrier 1 further includes several second connecting parts 14 (e.g. perforations) corresponding to the first connecting parts 26. By screwing a fixing element 27 (e.g. a screw) into the perforations 26 and 14, the shielding frame 21 is fixed onto the second surface 12 of the circuit carrier 1. The shielding plate 22 is fixed onto the shielding frame 21 via a fastening, bonding or screwing mechanism. As a consequence, the shielding frame 21 and the shielding plate 22 cooperatively define the closed space 3 for accommodating and shielding the specific region 13 of the circuit carrier 1, thereby preventing foreign matters from entering the specific region 13.

Figure 5:
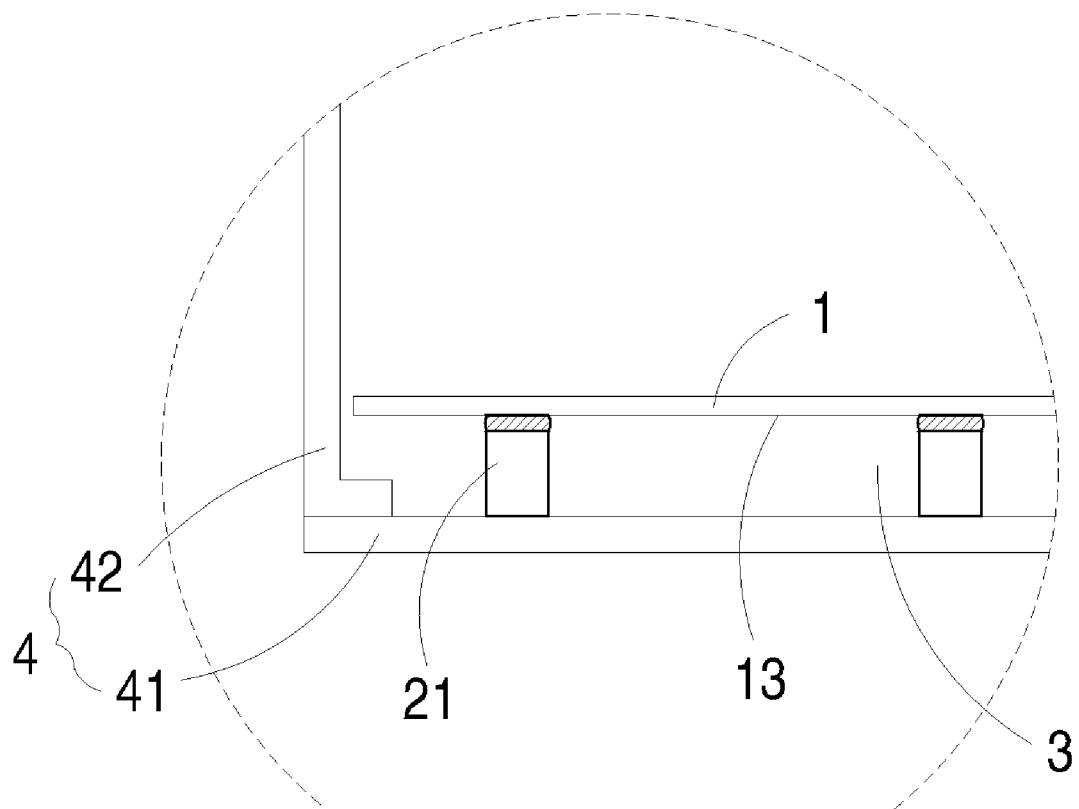
FIG. 5 is a partial cross-sectional view illustrating the electronic device having the circuit protecting structure according to a further preferred embodiment of the present invention.
Figure 6:
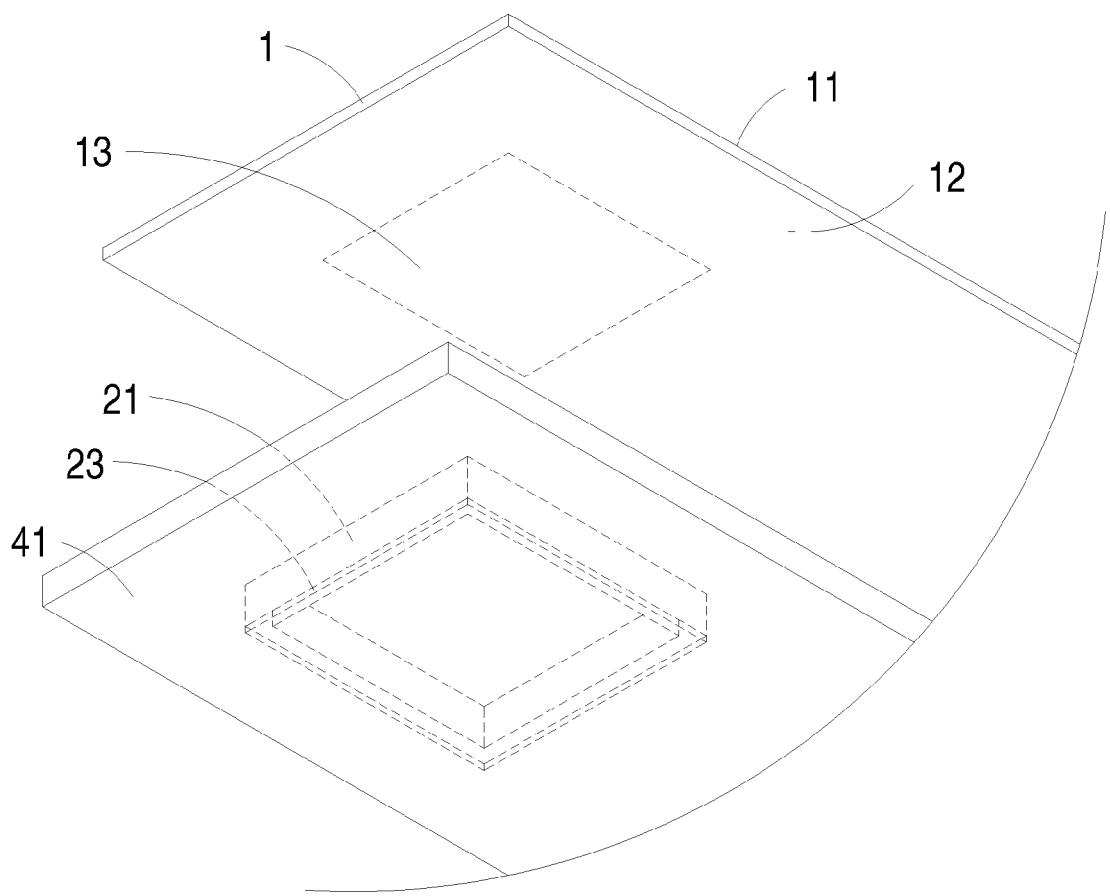
FIG. 6 is a partial perspective view illustrating the attachment of the shielding member on the cover plate of the housing.

FIG. 5 is a partial cross-sectional view illustrating an electronic device having a circuit protecting structure according to another embodiment of the present invention. The shielding frame 21 of the shielding member 2 is arranged on the second surface 12 of the circuit carrier 1 and encloses the specific region 13. In this embodiment, the shielding plate 22 is dispensed with. For example, as shown in FIG. 6, a first side of the shielding frame 21 is firstly fixed onto the inner surface of the cover plate 41 of the housing 4 via an adhesive medium 23, and then a second side of the shielding frame 21 is fixed onto the circuit carrier 1 via a fastening, bonding or screwing mechanism. The shielding frame 21 and the cover plate 41 of the housing 4 cooperatively define a closed space 3 for accommodating and shielding the specific region 13 of the circuit carrier 1, thereby preventing foreign matters from entering the specific region 13.

Figures 7A, 7B:
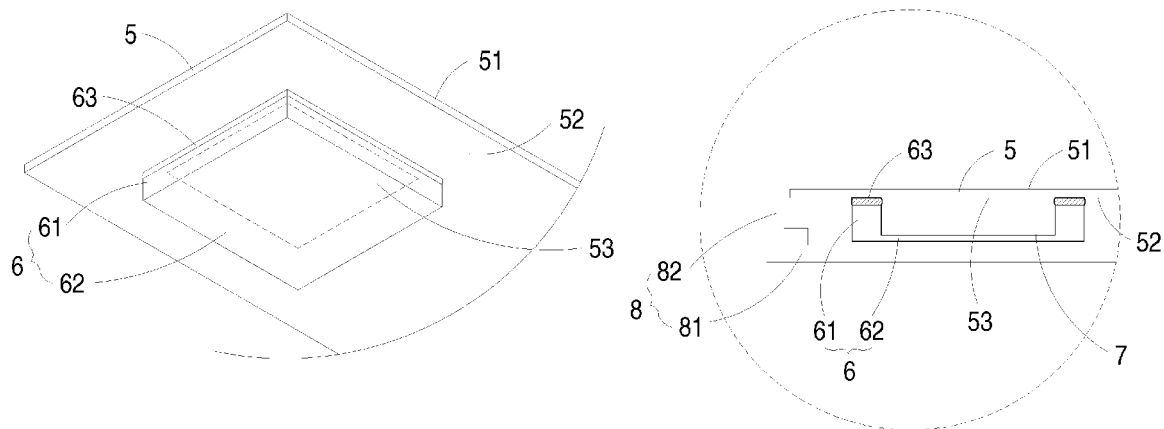
FIG. 7(a) is a schematic perspective view illustrating a circuit protecting structure of an electronic device according to a further preferred embodiment of the present invention.
FIG. 7(b) is a partial cross-sectional view illustrating the electronic device having the circuit protecting structure of FIG. 7(a)

Please refer to FIG. 7(a), which is a schematic perspective view illustrating a circuit protecting structure of an electronic device according to another preferred embodiment of the present invention. The electronic device is for example a power supply apparatus or a computer. The circuit protecting structure is used to prevent foreign matters such as vermin from entering a specific region of a circuit carrier such as a printed circuit board. The specific region is for example a high-voltage wiring region at the primary side of the printed circuit board. As shown in FIG. 7(a), the circuit protecting structure of this embodiment includes a circuit carrier 5 and a shielding member 6. The circuit carrier 5 includes a first surface 51 and a second surface 52. Many electronic components (not shown) are mounted on the first surface 51 of the circuit carrier 5. The specific region 53 is disposed on the second surface 52 of the circuit carrier 5. The shielding member 6 includes a shielding frame 61 and a shielding plate 62, which are integrally formed into one piece. The shielding member 6 is arranged on the second surface 52 of the circuit carrier 5 and defines a closed space for accommodating and shielding the specific region 53 of the circuit carrier 5, thereby preventing foreign matters from entering the specific region 53. In some embodiment, the shielding member 6 is made of insulating material such as rubbery or plastic material.

Please refer to FIG. 7(b), which is a partial cross-sectional view illustrating the electronic device having the circuit protecting structure of FIG. 7(a). In this embodiment, the shielding member 6 is coupled to the circuit carrier 5 via a bonding mechanism. As shown in FIG. 7(b), the circuit carrier 5 is arranged within a housing 8 of the electronic device. The housing 8 includes a cover plate 81 and a frame body 82. Via an adhesive medium 63, the shielding frame 61 is bonded onto the second surface 52 of the circuit carrier 5 so as to enclose the specific region 53. As a consequence, the shielding member 6 defines the closed space 7 for accommodating and shielding the specific region 53 of the circuit carrier 5, thereby preventing foreign matters from entering the specific region 53.

Figures 8A, 8B:
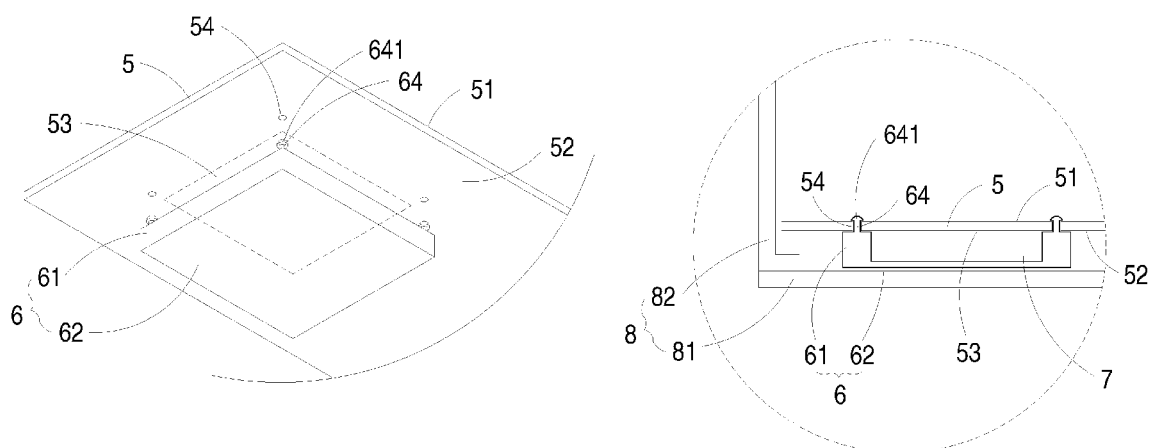
FIG. 8(a) is a schematic perspective view illustrating another circuit protecting structure of the present invention by fixing the shielding frame on the circuit carrier via a fastening mechanism.
FIG. 8(b) is a partial cross-sectional view illustrating the electronic device having the circuit protecting structure of FIG. 8(a)

A further embodiment of a circuit protecting structure is illustrated in FIGS. 8(a) and 8(b). In this embodiment, the shielding member 6 is coupled to the circuit carrier 5 via a fastening mechanism. The circuit carrier 5 is arranged within a housing 8 of the electronic device. The housing 8 includes a cover plate 81 and a frame body 82. For fixing the shielding frame 61 to the circuit carrier 5, the bottom of the shielding frame 61 has several first connecting parts 64 (e.g. protrusion posts) and the circuit carrier 5 further includes several second connecting parts 54 (e.g. perforations) corresponding to the first connecting parts 64. The first connecting part 64 (e.g. protrusion posts) has expanded free ends 641 penetrating through the second connecting part 54 (e.g. perforations) and then sustained against the first surface 51 of the circuit carrier 5, so that the shielding frame 61 is fixed onto the circuit carrier 5 and encloses the specific region 53. The shielding member 6 includes a shielding frame 61 and a shielding plate 62, which are integrally formed into one piece. As a consequence, the shielding member 6 defines the closed space 7 for accommodating and shielding the specific region 53 of the circuit carrier 5, thereby preventing foreign matters from entering the specific region 53.

Figures 9A, 9B:
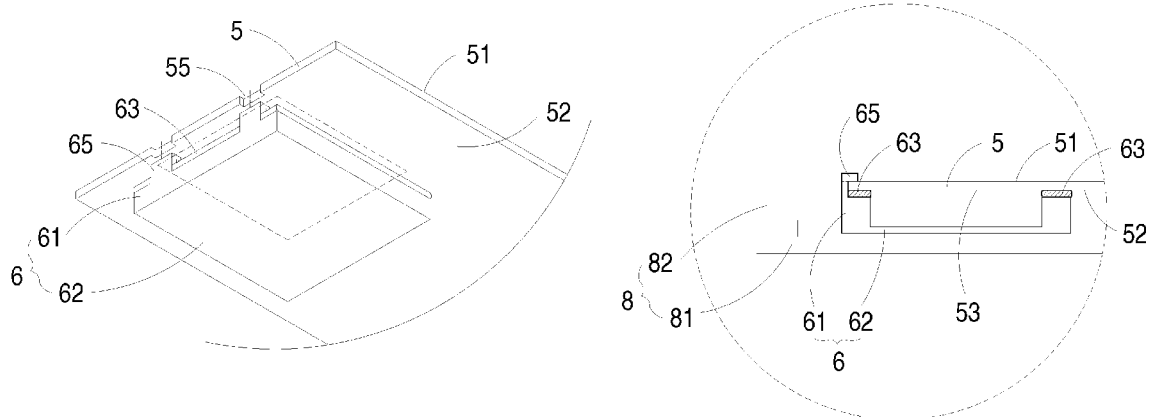
FIG. 9(a) is a schematic perspective view illustrating another circuit protecting structure of the present invention by fixing the shielding frame on the circuit carrier via a fastening mechanism and a bonding mechanism.
FIG. 9(b) is a partial cross-sectional view illustrating the electronic device having the circuit protecting structure of FIG. 9(a)

A further embodiment of a circuit protecting structure is illustrated in FIGS. 9(a) and 9(b). In this embodiment, the shielding member 6 is coupled to the circuit carrier 5 via a fastening mechanism and a bonding mechanism. The circuit carrier 5 is arranged within a housing 8 of the electronic device. The housing 8 includes a cover plate 81 and a frame body 82. For fixing the shielding frame 61 to the circuit carrier 5, the edge of the circuit carrier 5 further includes several notches 55 and the shielding frame 61 has several hooking elements 65 corresponding to the notches 55. The hooking elements 65 are attached onto the first surface 51 of the circuit carrier 5 through the notches 55, so that the shielding frame 61 is fixed onto the second surface 52 of the circuit carrier 5 and encloses the specific region 53. For facilitating secure attachment of the shielding frame 61, the shielding frame 61 is also bonded onto the second surface 52 of the circuit carrier 5 via an adhesive medium 63. The shielding member 6 includes a shielding frame 61 and a shielding plate 62, which are integrally formed into one piece. As a consequence, the shielding member 6 defines the closed space 7 for accommodating and shielding the specific region 53 of the circuit carrier 5, thereby preventing foreign matters from entering the specific region 53.

Figures 10A, 10B:
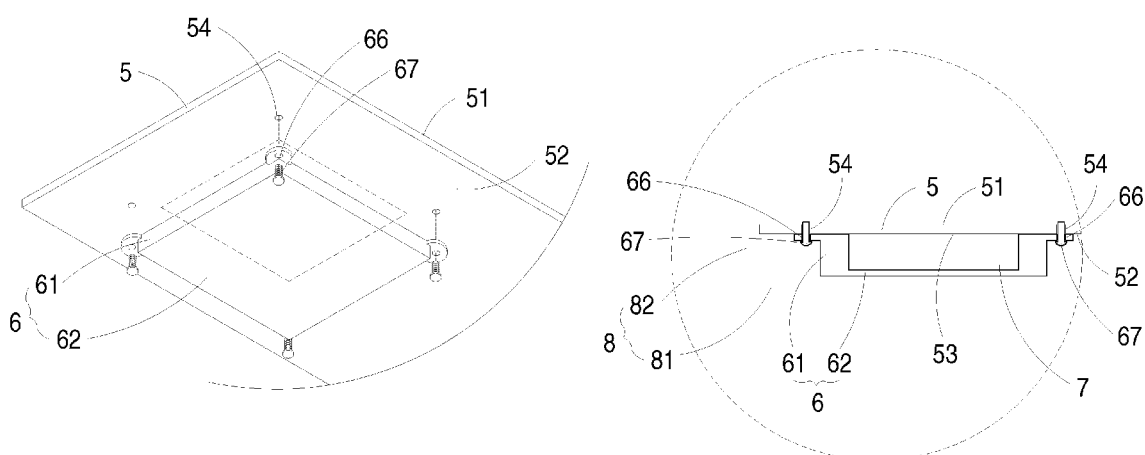
FIG. 10(a) is a schematic perspective view illustrating another circuit protecting structure of the present invention by fixing the shielding frame on the circuit carrier via a screwing mechanism.
FIG. 10(b) is a partial cross-sectional view illustrating the electronic device having the circuit protecting structure of FIG. 10(a)

A further embodiment of a circuit protecting structure is illustrated in FIGS. 10(a) and 10(b). In this embodiment, the shielding member 6 is coupled to the circuit carrier 5 via a screwing mechanism. The circuit carrier 5 is arranged within a housing 8 of the electronic device. The housing 8 includes a cover plate 81 and a frame body 82. The shielding frame 61 has several first connecting parts 66 (e.g. perforations) and the circuit carrier 5 further includes several second connecting parts 54 (e.g. perforations) corresponding to the first connecting parts 66. By screwing a fixing element 67 (e.g. a screw) into the first connecting part 66 and the second connecting part 54 (e.g. perforations), the shielding frame 61 is fixed onto the second surface 52 of the circuit carrier 5. The shielding member 6 includes a shielding frame 61 and a shielding plate 62, which are integrally formed into one piece. As a consequence, the shielding member 6 defines the closed space 7 for accommodating and shielding the specific region 53 of the circuit carrier 5, thereby preventing foreign matters from entering the specific region 53.

Figures 11A, 11B:
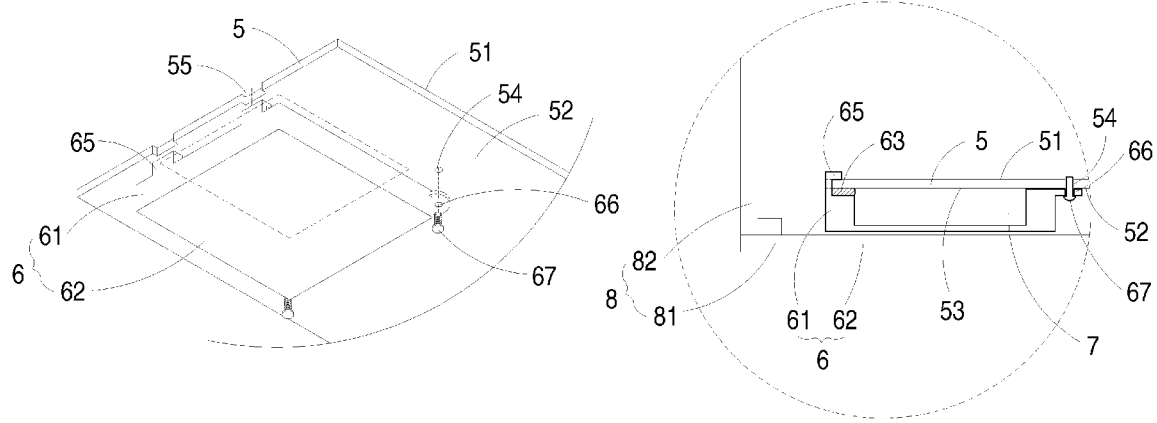
FIG. 11(a) is a schematic perspective view illustrating another circuit protecting structure of the present invention by fixing the shielding frame on the circuit carrier via a fastening mechanism and a screwing mechanism.
FIG. 11(b) is a partial cross-sectional view illustrating the electronic device having the circuit protecting structure of FIG. 11(a).

A further embodiment of a circuit protecting structure is illustrated in FIGS. 11(a) and 11(b). In this embodiment, the shielding member 6 is coupled to the circuit carrier 5 via a fastening mechanism and a screwing mechanism. The first edge of shielding frame 61 has several hooking elements 65 and the circuit carrier 5 includes several notches 55 corresponding to the hooking elements 65. The hooking elements 65 are attached onto the first surface 51 of the circuit carrier 5 through the notches 55. The second edge of the shielding frame 61 has several first connecting parts 66 (e.g. perforations) and the circuit carrier 5 further includes several second connecting parts 54 (e.g. perforations) corresponding to the first connecting parts 66. By screwing a fixing element 67 (e.g. a screw) into the first connecting part 66 and the second connecting part 54 (e.g. perforations), the shielding frame 61 is fixed onto the second surface 52 of the circuit carrier 5. The shielding member 6 includes a shielding frame 61 and a shielding plate 62, which are integrally formed into one piece. As a consequence, the shielding member 6 defines the closed space 7 for accommodating and shielding the specific region 53 of the circuit carrier 5, thereby preventing foreign matters from entering the specific region 53.

From the above description, the circuit protecting structure of an electronic device is capable of protecting the specific region of the circuit carrier, thereby preventing foreign matters from entering the specific region. Since the problems of causing undesirable system failure or data damage are avoided, the additional maintenance cost is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit protecting structure of an electronic device, said circuit protecting structure comprising:
   a circuit carrier including a first surface and a second surface, said first surface having plural electronic components mounted thereon and said second surface including a specific region thereon; and
   a shielding member including a shielding frame and a shielding plate, wherein said shielding frame is arranged on said second surface of said circuit carrier and encloses said specific region, said shielding frame is made of insulating material, said shielding plate is fixed onto said shielding frame, and said shielding frame and said shielding plate cooperatively define a closed space for accommodating and shielding said specific region of said circuit carrier.

2. The circuit protecting structure according to claim 1 wherein said electronic device is a power supply apparatus, and said specific region is a high-voltage wiring region at a primary side of said circuit carrier.

3. The circuit protecting structure according to claim 1 wherein said shielding frame is bonded onto said second surface of said circuit carrier via an adhesive medium so as to enclose said specific region of said circuit carrier.

4. The circuit protecting structure according to claim 1 wherein said shielding frame includes plural first connecting parts and said circuit carrier includes plural second connecting parts corresponding to said first connecting parts, wherein said shielding frame is fixed onto said second surface of said circuit carrier and enclose said specific region of said circuit carrier by fastening said first connecting parts into said second connecting parts.

5. The circuit protecting structure according to claim 4 wherein said first connecting parts of said shielding frame are protrusion posts, and said second connecting parts of said circuit carrier are perforations.

6. The circuit protecting structure according to claim 1 wherein said shielding frame includes plural hooking elements and the edges of said circuit carrier includes plural second notches corresponding to said hooking elements, wherein said shielding frame is fixed onto said second surface of said circuit carrier and enclose said specific region of said circuit carrier by attaching said hooking elements onto said first surface of the circuit carrier through said notches.

7. The circuit protecting structure according to claim 1 wherein said shielding frame includes plural first perforations and said circuit carrier includes plural second perforations corresponding to said first perforations, wherein said shielding frame is fixed onto said second surface of said circuit carrier and enclose said specific region of said circuit carrier by screwing plural fixing element into said first perforations and said second perforations.

8. The circuit protecting structure according to claim 1 wherein said shielding plate is fixed onto said shielding frame via a fastening, bonding or screwing mechanism.

9. The circuit protecting structure according to claim 1 wherein said shielding plate is integrally formed with said shielding frame.

10. The circuit protecting structure according to claim 1 wherein said circuit carrier is a circuit board.

11. A circuit protecting structure of an electronic device, said circuit protecting structure comprising:
    a housing including a cover plate and a frame body;
    a circuit carrier disposed within said housing and including a first surface and a second surface, wherein said first surface has plural electronic components mounted thereon and said second surface includes a specific region thereon; and
    a shielding member including a shielding frame, which is arranged on said second surface of said circuit carrier and encloses said specific region, wherein said shielding frame is made of insulating material and said cover plate is in contact with said shielding frame to define a closed space for accommodating and shielding said specific region of said circuit carrier.

12. The circuit protecting structure according to claim 11 wherein said electronic device is a power supply apparatus, and said specific region is a high-voltage wiring region at a primary side of said circuit carrier.

13. The circuit protecting structure according to claim 11 wherein said shielding frame is bonded onto said second surface of said circuit carrier via an adhesive medium so as to enclose said specific region of said circuit carrier.

14. The circuit protecting structure according to claim 11 wherein said shielding frame includes plural first connecting parts and said circuit carrier includes plural second connecting parts corresponding to said first connecting parts, wherein said shielding frame is fixed onto said second surface of said circuit carrier and enclose said specific region of said circuit carrier by fastening said first connecting parts into said second connecting parts.

15. The circuit protecting structure according to claim 14 wherein said plural first connecting parts of said shielding frame are protrusion posts, and said plural second connecting parts of said circuit carrier are perforations.

16. The circuit protecting structure according to claim 11 wherein said shielding frame includes plural hooking elements and the edges of said circuit carrier includes plural second notches corresponding to said hooking elements, wherein said shielding frame is fixed onto said second surface of said circuit carrier and enclose said specific region of said circuit carrier by attaching said hooking elements onto said first surface of the circuit carrier through said notches.

17. The circuit protecting structure according to claim 11 wherein said shielding frame includes plural first perforations and said circuit carrier includes plural second perforations corresponding to said first connecting parts, wherein said shielding frame is fixed onto said second surface of said circuit carrier and enclose said specific region of said circuit carrier by screwing plural fixing elements into said first perforations and said second perforations.

18. The circuit protecting structure according to claim 11 wherein said shielding plate is fixed onto said shielding frame via a fastening, bonding or screwing mechanism.

19. The circuit protecting structure according to claim 11 wherein said shielding plate is integrally formed with said shielding frame.

20. The circuit protecting structure according to claim 11 wherein said circuit carrier is a circuit board.

* * * * *